United States Patent
Shiga et al.

(10) Patent No.: US 7,525,650 B2
(45) Date of Patent: Apr. 28, 2009

(54) SUBSTRATE PROCESSING APPARATUS FOR PERFORMING PHOTOLITHOGRAPHY

(75) Inventors: Masayoshi Shiga, Kyoto (JP); Kenji Hashinoki, Kyoto (JP); Yasufumi Koyama, Kyoto (JP)

(73) Assignee: Dainippon Screen Mfg., Co., Ltd. (JP)

( * ) Notice: Subject to any disclaimer, the term of this patent is extended or adjusted under 35 U.S.C. 154(b) by 935 days.

(21) Appl. No.: 10/945,014

(22) Filed: Sep. 20, 2004

(65) Prior Publication Data

US 2005/0061242 A1    Mar. 24, 2005

(30) Foreign Application Priority Data

Sep. 19, 2003    (JP)    ............... 2003-328501

(51) Int. Cl.
   *G01N 21/00*    (2006.01)
   *G01R 31/26*    (2006.01)
   *H01L 21/66*    (2006.01)

(52) U.S. Cl. ..................... 356/237.5; 438/16

(58) Field of Classification Search ... 356/237.1–237.5, 356/625, 630–636; 438/5, 7–9, 14, 16; 250/559.4–559.49
See application file for complete search history.

(56) References Cited

U.S. PATENT DOCUMENTS

| | | | |
|---|---|---|---|
| 4,852,516 A * | 8/1989 | Rubin et al. ................. 118/715 |
| 6,313,903 B1 | 11/2001 | Ogata | |
| 6,722,798 B2 | 4/2004 | Senba et al. | |
| 6,763,130 B1 * | 7/2004 | Somekh et al. ............. 382/145 |
| 6,790,287 B2 | 9/2004 | Shiga et al. | |
| 6,841,403 B2 * | 1/2005 | Tanaka et al. .................. 438/14 |
| 6,960,416 B2 * | 11/2005 | Mui et al. ..................... 430/30 |
| 6,975,920 B2 * | 12/2005 | Kahn et al. .................. 700/218 |
| 7,375,831 B2 * | 5/2008 | Tanaka et al. ............... 356/636 |

2002/0165636 A1 * 11/2002  Hasan ........................ 700/121

(Continued)

FOREIGN PATENT DOCUMENTS

JP    10-294351    11/1998

(Continued)

OTHER PUBLICATIONS

List of Enclosures prepared by Applicant matching U.S. counterpart applications to untranslated Japanese patent applications.

*Primary Examiner*—Patrick J Connolly
(74) *Attorney, Agent, or Firm*—Ostrolenk, Faber, Gerb & Soffen, LLP

(57) ABSTRACT

A substrate processing apparatus for performing a resist coating process and a development process includes an inspection block for making an inspection on a substrate having undergone the development process. The inspection block has an inspection unit for making a predetermined inspection and a transport robot for transferring a substrate to and from the inspection unit. When a substrate to be inspected is transported to the inspection block, the transport robot transports the substrate to the inspection unit. When a substrate not to be inspected is transported to the inspection block, the transport robot transports the substrate directly to the outlet of the inspection block. At this time, a substrate not to be inspected is allowed to pass a preceding substrate to be inspected, at the inspection block. Thus provided is a substrate processing apparatus capable of improving the transport efficiency, to thereby achieve a higher throughput.

8 Claims, 7 Drawing Sheets

FOREIGN PATENT DOCUMENTS

| | | |
|---|---|---|
| JP | 10-3354116 | 12/1998 |
| JP | 2000-223401 | 8/2000 |
| JP | 2002-050668 | 2/2002 |
| JP | 2002-151403 | 5/2002 |
| JP | 2003-209154 | 7/2003 |

* cited by examiner

SUBSTRATE PROCESSING APPARATUS FOR PERFORMING PHOTOLITHOGRAPHY

BACKGROUND OF THE INVENTION

1. Field of the Invention

The present invention relates to a substrate processing apparatus for performing a resist coating process on semiconductor substrates, glass substrates for liquid crystal displays, glass substrates for photomasks, substrates for optical disks or the like (hereinafter briefly referred to as "substrates") transferred out of an indexer in a predetermined order as well as performing a development process on the substrates once transported to the outside of the apparatus to undergo an exposure process and then transported back into the apparatus and returning the substrates to the indexer. More particularly, the present invention relates to a substrate processing apparatus for making inspections at inspection units on substrates having undergone the development process.

2. Description of the Background Art

As is well known, products such as semiconductors and liquid crystal displays are manufactured by performing a series of processes including cleaning, resist coating, exposure, development, etching, formation of interlayer dielectric films, thermal processing, dicing and the like, on the above-described substrates. Widely used as a so-called coater/developer is a substrate processing apparatus in which a plurality of processing units for performing, for example, among the series of processes, resist coating, development and their associated thermal processes, respectively, are incorporated, and transport robots circularly transport substrates between the respective processing units, so that the substrates are subjected to a series of photolithography processes.

Recently, such substrate processing apparatus is equipped with inspection units for making various kinds of inspections on substrates for quality verification in order to maintain the quality of semiconductor products or the like, as proposed in Japanese Patent Application Laid-Open Nos. 2000-223401, 2002-151403 and 2003-209154, for example. For instance, a substrate processing apparatus includes a film thickness measurement unit for measuring the film thickness of a substrate with a resist film formed thereon and a line width measurement unit for measuring the line width of a pattern after the development process is performed.

In the above-described substrate processing apparatus, substrates are subjected to a series of photolithography processes in the order transferred out of an indexer which takes out a substrate from a carrier for storing unprocessed substrates and transfers the substrate outwardly to a processing unit. That is, a substrate transferred out of the indexer later is prohibited from passing a preceding substrate transferred out of the indexer earlier during a series of processes. This is because processing uniformity among a plurality of substrates should be ensured and because allowing such passing will extremely complicate a program for transport control.

On the other hand, in a substrate processing apparatus equipped with inspection units, inspections are generally made on some of substrates at random, not on all substrates subjected to processing (i.e., so-called sampling inspection). It is not necessary to transport substrates not to be inspected (hereinafter also referred to as non-inspected substrates) to the inspection units, however, such non-inspected substrates are transported to the inspection units in accordance with a predetermined transport order and are taken out from the inspection units after a lapse of a predetermined time period without making any inspection because substrates have conventionally been prohibited from passing preceding substrates. Such transport without any processing degrades the transport efficiency of the apparatus as a whole, resulting in a decrease in throughput.

SUMMARY OF THE INVENTION

The present invention is directed to a substrate processing apparatus for performing a resist coating process on substrates transferred out of an indexer in a predetermined order as well as performing a development process on the substrates once transported out of said substrate processing apparatus to undergo an exposure process and then transported back into said substrate processing apparatus, and then returning the substrates to said indexer.

According to the invention, the substrate processing apparatus comprises an inspection block including an inspection unit for making a predetermined inspection on substrates having undergone said development process and a transport mechanism for transferring substrates to and from said inspection unit, and a transport control unit for controlling said transport mechanism to allow substrates not to be inspected among substrates having undergone said development process to pass substrates to be inspected, at said inspection block.

Since substrates not to be inspected among substrates having undergone the development process are allowed to pass substrates to be inspected, at the inspection block, it is unnecessary to transport substrates not to be inspected to and from the inspection unit without any processing. This can improve the transport efficiency, to thereby achieve a higher throughput.

Preferably, substrates having passed substrates to be inspected, at said inspection block, are returned to said indexer in the order after the passing.

The transport efficiency can further be improved.

It is therefore an object of the present invention to provide a substrate processing apparatus capable of improving the transport efficiency, to thereby achieve a higher throughput.

These and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, a preferred embodiment of the present invention will be described in detail in reference to the accompanying drawings.

Figure 1:
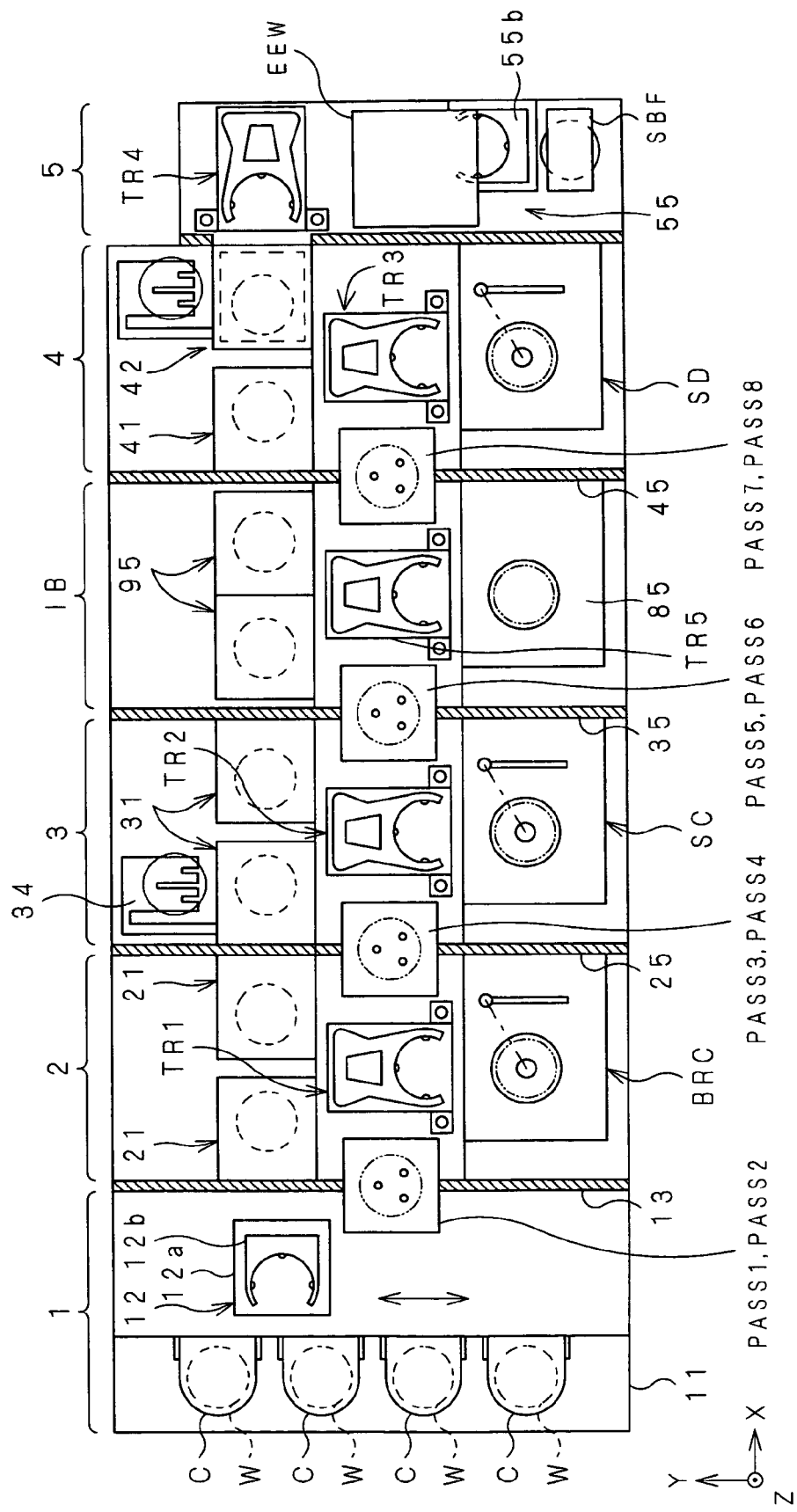
FIG. 1 is a plan view of a substrate processing apparatus according to a preferred embodiment of the present invention.
Figure 2:
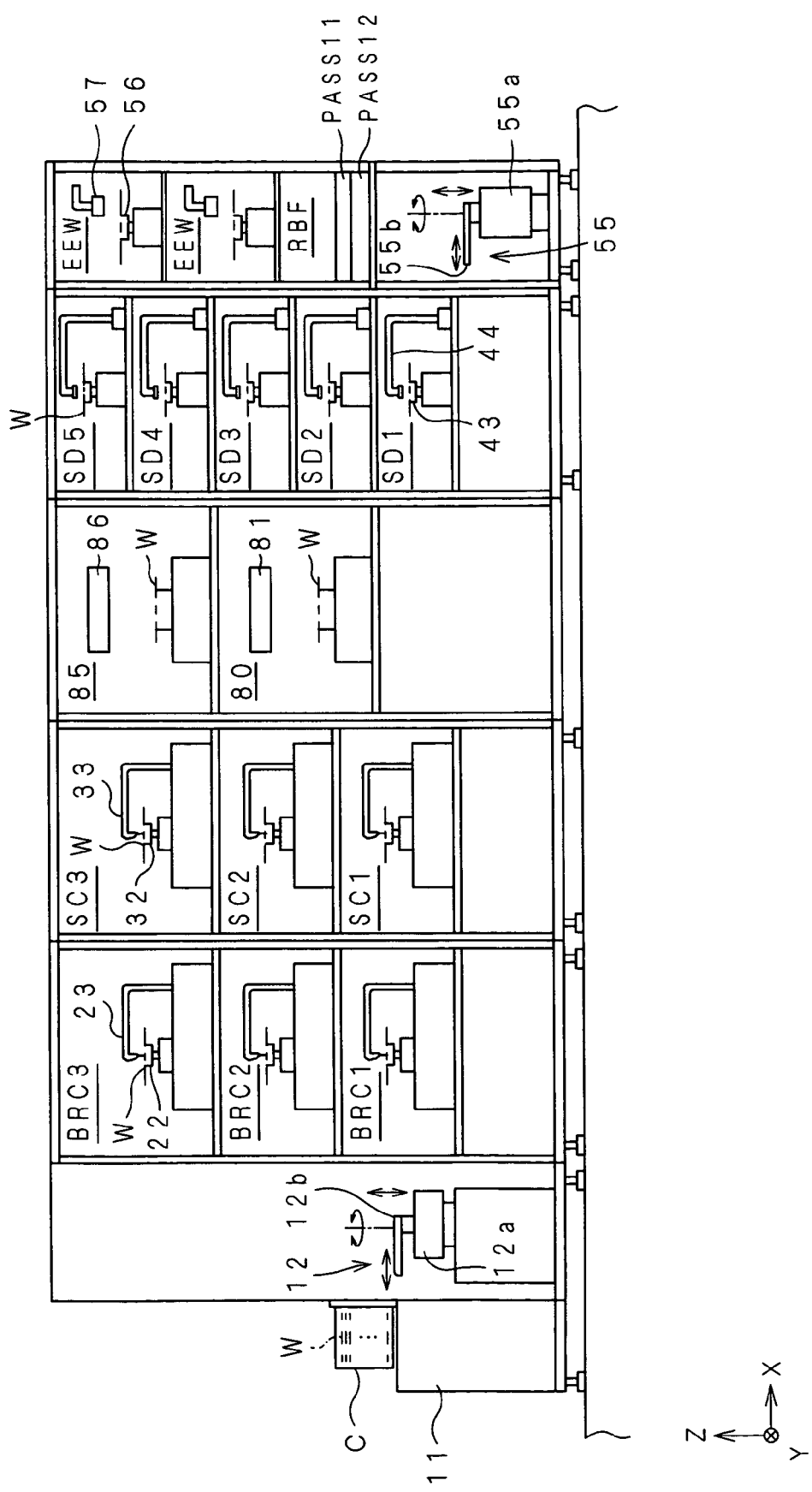
FIG. 2 is a front view of a chemical processor of the substrate processing apparatus shown in FIG. 1.
Figure 3:
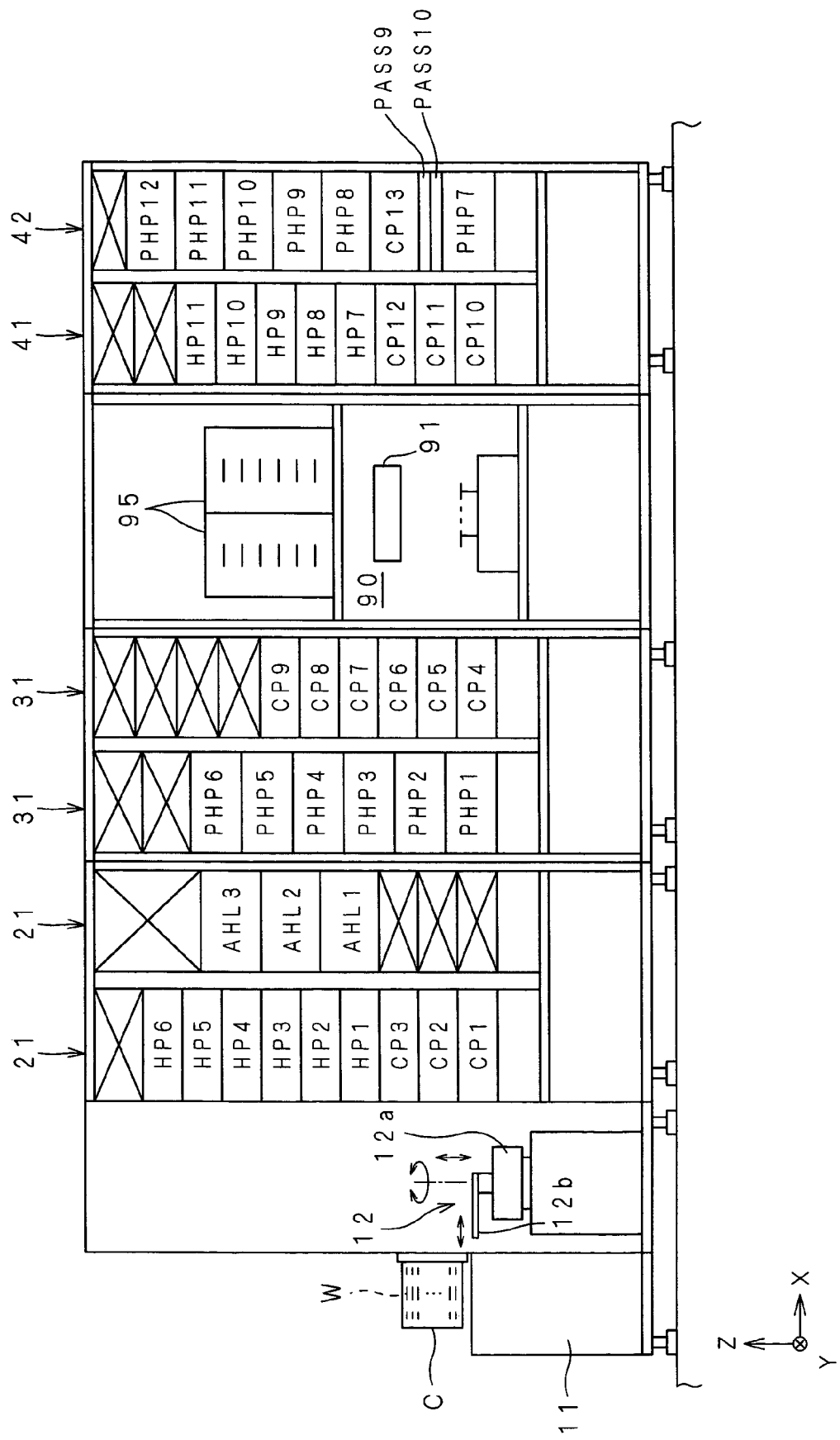
FIG. 3 is a front view of a thermal processor of the substrate processing apparatus shown in FIG. 1.
Figure 4:
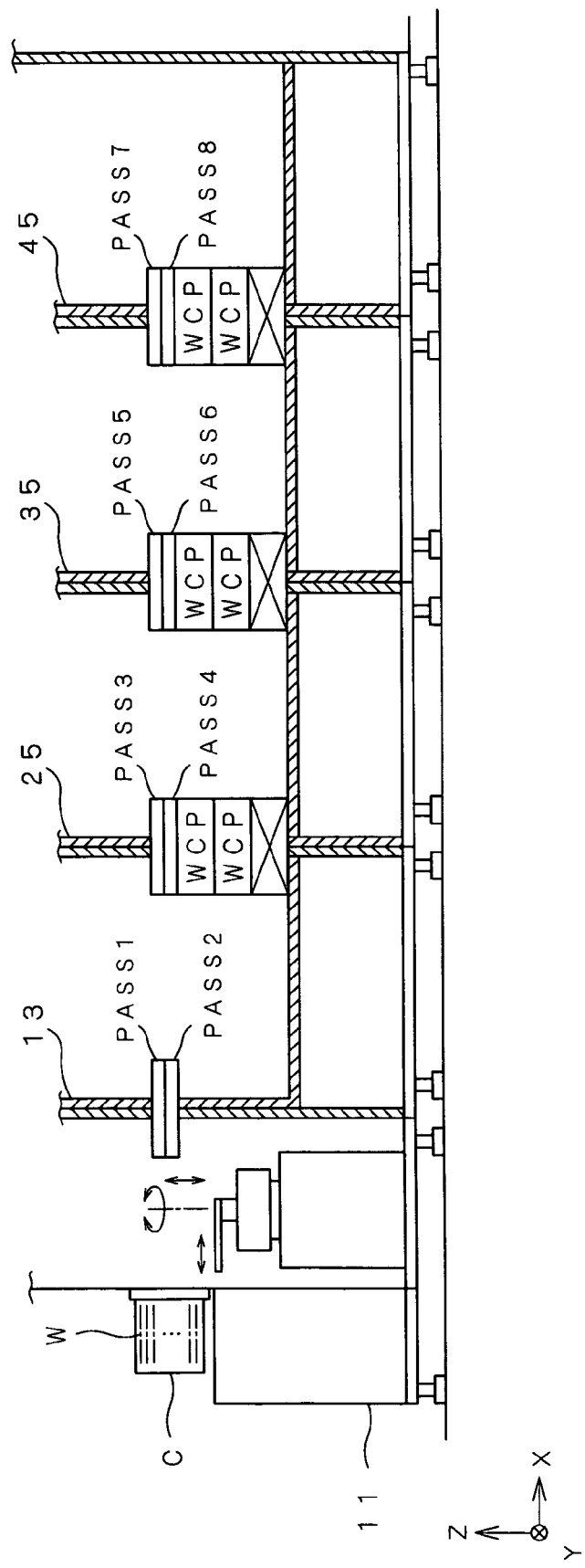
FIG. 4 illustrates a peripheral structure of substrate rest parts of the substrate processing apparatus shown in FIG. 1.

FIG. 1 is a plan view of a substrate processing apparatus according to the present preferred embodiment. FIG. 2 is a front view of a chemical processor of the substrate processing apparatus. FIG. 3 is a front view of a thermal processor. FIG. 4 illustrates a peripheral structure of substrate rest parts. FIGS. 1 to 4 include an XYZ rectangular coordinate system which defines the direction of the Z axis as the vertical direction and the X-Y plane as the horizontal plane.

The substrate processing apparatus according to the present embodiment is an apparatus for coating a substrate such as a semiconductor wafer with an antireflective film and a photoresist film as well as for conducting a development process on a substrate with a pattern transferred thereto by exposure. Substrates to be processed by the substrate processing apparatus of the present invention are not limited to semiconductor wafers, but may be glass substrates for liquid crystal displays, or the like.

The substrate processing apparatus according to the present embodiment comprises six processing blocks arranged in parallel: an indexer block 1; a BARC (bottom antireflective coating) block 2; a resist coating block 3; a development processing block 4; an interface block 5; and an inspection block IB. An exposure apparatus (stepper) which is an external apparatus provided separately from the substrate processing apparatus is connected to the interface block 5.

The indexer block 1 comprises a carrier table 11 for placing thereon a plurality of (in the present embodiment, four) carriers C in line and a substrate transport mechanism 12 for taking out an unprocessed substrate W from each of the carriers C and storing a processed substrate W into each of the carriers C. The substrate transport mechanism 12 includes a movable table 12a movable horizontally along the carrier table 11 (along the Y axis), and a holding arm 12b for holding a substrate W in a horizontal position is mounted on the movable table 12a. The holding arm 12b is movable up and down over the movable table 12a (along the Z axis), pivotable within a horizontal plane and movable back and forth in the direction of the pivot radius. The substrate transport mechanism 12 can thereby moves the holding arm 12b to get access to each of the carriers C to take out an unprocessed substrate W therefrom and to store a processed substrate W therein. The carriers C may be of any of the following types: a FOUP (front opening unified pod) for storing substrates W in an enclosed or sealed space, an SMIF (standard mechanism interface) pod and an OC (open cassette) which exposes stored substrates W to the open air.

The BARC block 2 is provided adjacently to the indexer block 1. Between the indexer block 1 and BARC block 2, a partition 13 for closing off the communication of atmosphere between the blocks is provided. Two substrate rest parts PASS1 and PASS2 each for placing a substrate W thereon to transfer the substrate W between the indexer block 1 and BARC block 2 are provided in stacked relation to extend through this partition 13.

The upper substrate rest part PASS1 is used to transfer a substrate W from the indexer block 1 to the BARC block 2. The substrate rest part PASS1 is provided with three support pins, and the substrate transport mechanism 12 of the indexer block 1 places an unprocessed substrate W taken out from a carrier C on the three support pins of the substrate rest part PASS1. Then, a transport robot TR1 of the BARC block 2 which will be described later receives the substrate W placed on the substrate rest part PASS1. The lower substrate rest part PASS2 is used to transfer a substrate W from the BARC block 2 to the indexer block 1. The substrate rest part PASS2 is also provided with three support pins, and the transport robot TR1 of the BARC block 2 places a processed substrate W on the three support pins of the substrate rest part PASS2. Then, the substrate transport mechanism 12 receives the substrate W placed on the substrate rest part PASS2 to store the substrate W in a carrier C. Substrate rest parts PASS3 to PASS12 which will be described later have the same construction as the substrate rest parts PASS1 and PASS2.

The substrate rest parts PASS1 and PASS2 both partly extend through part of the partition 13, and are each provided with an optical sensor (not shown) for detecting the presence or absence of a substrate W. In response to detection signals from the respective sensors, it is judged whether or not the substrate transport mechanism 12 and transport robot TR1 of the BARC block 2 are in a state of readiness to transfer and receive a substrate W to and from the substrate rest parts PASS1 and PASS2.

Next, the BARC block 2 will be described. The BARC block 2 is a processing block for forming an antireflective film under a photoresist film in order to reduce standing waves or halation occurring during exposure. The BARC block 2 comprises an underlying film coating processor BRC for coating the surface of a substrate W with the antireflective film, two thermal processing towers 21, 21 each for performing a thermal process associated with the coating of the antireflective film and the transport robot TR1 for transferring and receiving a substrate W to and from the underlying film coating processor BRC and the thermal processing towers 21, 21.

In the BARC block 2, the underlying film coating processor BRC and the thermal processing towers 21, 21 are arranged opposite to each other with the transport robot TR1 interposed therebetween. Specifically, the underlying film coating processor BRC is positioned on the front side of the apparatus, and the two thermal processing towers 21, 21 are positioned on the rear side of the apparatus. A thermal barrier not shown is provided on the front side of the thermal processing towers 21, 21. Arranging the underlying film coating processor BRC and the thermal processing towers 21, 21 at a distance and providing the thermal barrier prevent the underlying film coating processor BRC from suffering from the thermal effect caused by the thermal processing towers 21, 21.

Referring to FIG. 2, the underlying film coating processor BRC includes three coating processing units BRC1 to BRC3 having the same construction, arranged in stacked relation in ascending order. Hereinafter, where there is no need to distinguish the three coating processing units BRC1 to BRC3 from one another, these units will collectively be referred to as the underlying film coating processor BRC. Each of the three coating processing units BRC1 to BRC3 is provided with a spin chuck 22 for rotating a substrate W within an almost horizontal plane while holding the substrate W in an almost horizontal position under suction, a discharging nozzle 23 for discharging a coating solution for the antireflective film onto the substrate W held on the spin chuck 22, a spin motor (not shown) for rotatably driving the spin chuck 22, a cup (not shown) for surrounding the substrate W held on the spin chuck 22, and the like.

Referring to FIG. 3, one of the thermal processing towers 21 located close to the indexer block 1 is provided with six hot plates HP1 to HP6 for heating a substrate W to a predetermined temperature and cooling plates CP1 to CP3 for cooling the heated substrate W to a predetermined temperature and maintaining the substrate W at the predetermined temperature. In this one of the thermal processing towers 21, the cooling plates CP1 to CP3 and the hot plates HP1 to HP6 are stacked in ascending order. On the other hand, in the other one of the thermal processing towers 21 located away from the indexer block 1, three adhesion promotion processing units AHL1 to AHL3 for thermally processing a substrate W in an atmosphere of HMDS (hexamethyl disilazane) vapor for the purpose of promoting the adhesion of a resist film to the substrate W are stacked in ascending order. The locations indicated by the cross marks (x) in FIG. 3 are occupied by a piping and wiring section and a reserve empty space.

As described, stacking the coating processing units BRC1 to BRC3 and thermal processing units (hot plates HP1 to HP6, cooling plates CP1 to CP3 and adhesion promotion processing units AHL1 to AHL3) in multistage can reduce the footprint of the substrate processing apparatus. Further, providing the two thermal processing towers 21, 21 in parallel brings advantages of facilitating maintenance of the thermal processing units and removing the necessity of extending duct piping and a power supply necessary for the thermal processing units to a very high position.

Figure 5A:
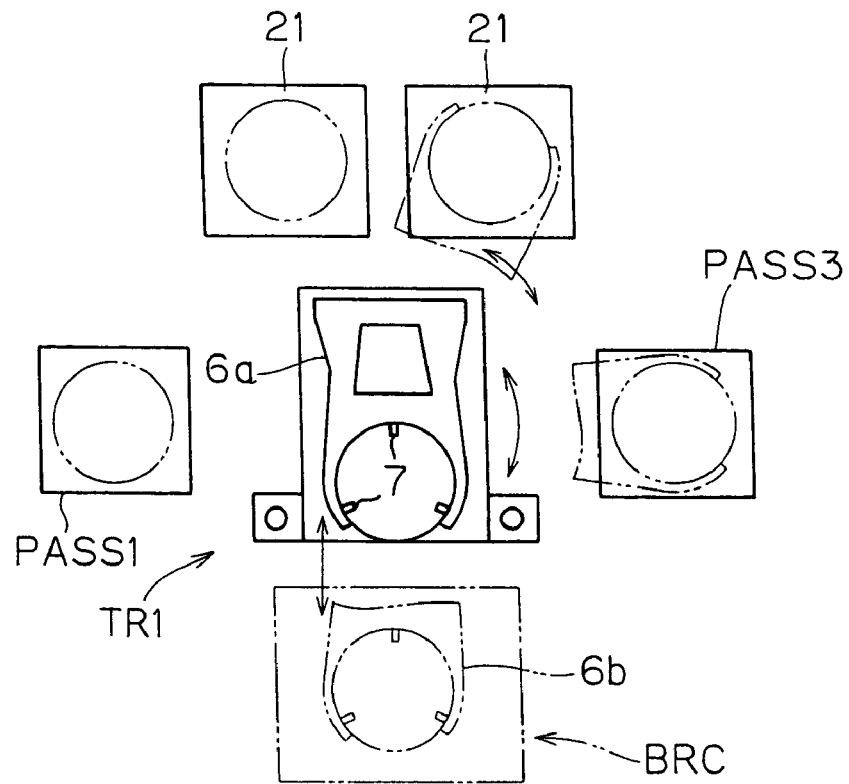
FIGS. 5A and 5B are explanatory views of a transport robot of the substrate processing apparatus shown in FIG. 1.
Figure 5B:
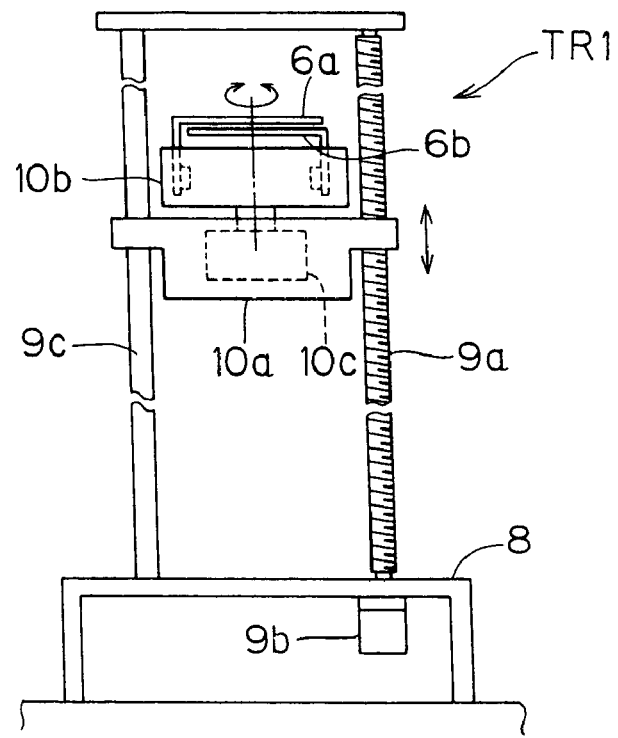

FIGS. 5A and 5B are explanatory views of the transport robot TR1. FIG. 5A is a plan view and FIG. 5B is a front view of the transport robot TR1. The transport robot TR1 is provided with two holding arms 6a and 6b arranged one above the other in close contact with each other, for supporting a substrate W in an almost horizontal position. The holding arms 6a and 6b each have a C-shaped distal end portion in a plan view, and a plurality of pins 7 projecting inwardly of the inner side of the C-shaped distal end portions hold the periphery of a substrate W from underneath.

A base 8 of the transport robot TR1 is fixedly provided on a base of the apparatus (apparatus frame). On the base 8, a guide shaft 9c is provided in a standing manner, and a screw shaft 9a is rotatably supported in a standing manner. A motor 9b is also fixedly provided on the base 8 for rotatably driving the screw shaft 9a. Then, the screw shaft 9a is brought into threaded engagement with an elevating table 10a, which is slidably movable along the guide shaft 9c. With such construction, the motor 9b rotatably drives the screw shaft 9a, so that the elevating table 10a is guided along the guide shaft 9c to move up and down in the vertical direction (along the Z axis).

An arm base 10b is provided on the elevating table 10a pivotably about an axis extending in the vertical direction. The elevating table 10a includes therein a motor 10c for pivotably driving the arm base 10b. The above-described two holding arms 6a and 6b are arranged one above the other on the arm base 10b. Each of the holding arms 6a and 6b is configured to be movable back and forth independently in the horizontal direction (in the direction of the pivot radius of the arm base 10b) by means of a sliding drive mechanism (not shown) equipped with the arm base 10b.

With such construction, as shown in FIG. 5A, the transport robot TR1 moves its two holding arms 6a and 6b to independently get access to the substrate rest parts PASS1, PASS2, the thermal processing units provided in the thermal processing towers 21, the coating processing units provided in the underlying film coating processor BRC and the substrate rest parts PASS3 and PASS4 which will be described later, so that a substrate W can be transferred and received to and from these units.

Next, the resist coating block 3 will be described. The resist coating block 3 is sandwiched between the BARC block 2 and inspection block IB. Between the BARC block 2 and resist coating block 3, a partition 25 for closing off the communication of atmosphere between the blocks is provided. The two substrate rest parts PASS3 and PASS4 each for placing a substrate W thereon to transfer the substrate W between the BARC block 2 and resist coating block 3 are arranged in stacked relation to extend through this partition 25. The substrate rest parts PASS3 and PASS4 have the same construction as the above-described substrate rest parts PASS1 and PASS2.

The upper substrate rest part PASS3 is used to transfer a substrate W from the BARC block 2 to the resist coating block 3. That is, a transport robot TR2 of the resist coating block 3 receives a substrate W placed on the substrate rest part PASS3 by the transport robot TR1 of the BARC block 2. The lower substrate rest part PASS4 is used to transport a substrate W from the resist coating block 3 to the BARC block 2. That is, the transport robot TR1 of the BARC block 2 receives a substrate W placed on the substrate rest part PASS4 by the transport robot TR2 of the resist coating block 3.

The substrate rest parts PASS3 and PASS4 both partly extend through part of the partition 25, and are each provided with an optical sensor (not shown) for detecting the presence or absence of a substrate W. In response to detection signals from the respective sensors, it is judged whether or not the transport robots TR1 and TR2 are in a state of readiness to transfer and receive a substrate W to and from the substrate rest parts PASS3 and PASS4. Further, two cooling plates WCP for roughly water-cooling a substrate W are provided in stacked relation under the substrate rest parts PASS3 and PASS4 to extend through the partition 25.

The resist coating block 3 is a processing block for forming the photoresist film on a substrate W coated with the antireflective film or subjected to the adhesion promoting process in the BARC block 2. In this preferred embodiment, a chemically amplified resist is used as the photoresist. The resist coating block 3 comprises a resist coating processor SC for coating the photoresist film on the antireflective film coated as an underlying film, two thermal processing towers 31, 31 each for performing a thermal process associated with the resist coating and the transport robot TR2 for transferring and receiving the substrate W to and from the resist coating processor SC and the thermal processing towers 31, 31.

In the resist coating block 3, the resist coating processor SC and the thermal processing towers 31, 31 are arranged opposite to each other with the transport robot TR2 interposed therebetween. Specifically, the resist coating processor SC is positioned on the front side of the apparatus, and the two thermal processing towers 31, 31 are positioned on the rear side of the apparatus. A thermal barrier not shown is provided on the front side of the thermal processing towers 31, 31. Arranging the resist coating processor SC and the thermal processing towers 31, 31 at a distance and providing the thermal barrier prevent the resist coating processor SC from suffering from the thermal effect caused by the thermal processing towers 31, 31.

As shown in FIG. 2, the resist coating processor SC includes three coating processing units SC1 to SC3 having the same construction, stacked in ascending order. Hereinafter, where there is no need to distinguish the three coating processing units SC1 to SC3 from one another, these units will collectively be referred to as the resist coating processor SC. Each of the three coating processing units SC1 to SC3 is provided with a spin chuck 32 for rotating a substrate W within an almost horizontal plane while holding the substrate W in an almost horizontal position under suction, a discharging nozzle 33 for discharging a photoresist onto the substrate W held on the spin chuck 32, a spin motor (not shown) for rotatably driving the spin chuck 32, a cup (not shown) for surrounding the substrate W held on the spin chuck 32, and the like.

As shown in FIG. 3, one of the thermal processing towers 31 located close to the indexer block 1 is provided with six heating units PHP1 to PHP6 for heating a substrate W to a predetermined temperature, stacked in ascending order. On the other hand, in the other one of the thermal processing towers 31 located away from the indexer block 1, cooling plates CP4 to CP9 for cooling the heated substrate W to a predetermined temperature and maintaining the substrate W at the predetermined temperature are stacked in ascending order.

Each of the heating units PHP1 to PHP6 is a thermal processing unit having an ordinary hot plate for placing a substrate W thereon and heating the substrate W as well as a temporary substrate rest part for placing a substrate W thereon above the hot plate at a distance and a local transport mechanism 34 (FIG. 1) for transporting a substrate W between the hot plate and temporary substrate rest part. The local transport mechanism 34 is movable up, down, back and forth, and is provided with a mechanism for circulating cooling water for cooling a substrate W on the way of transportation.

The local transport mechanism 34 is positioned on the opposite side of the transport robot TR2 with respect to the hot plate and temporary substrate rest part, that is, on the rear side of the apparatus. The temporary substrate rest part is opened toward both the transport robot TR2 and local transport mechanism 34, while the hot plate is opened only toward the local transport mechanism 34 and closed toward the transport robot TR2. Therefore, to the temporary substrate rest part, both the transport robot TR2 and local transport mechanism 34 are capable of getting access, however, to the hot plate, only the local transport mechanism 34 is capable of getting access.

For transporting a substrate W to each of the heating units PHP1 to PHP6 of such construction, the transport robot TR2 first places a substrate W on the temporary substrate rest part. Then, the local transport mechanism 34 receives the substrate W from the temporary substrate rest part and transports the substrate W to the hot plate, where the substrate W is subjected to a heating process. Upon completion of the heating process on the hot plate, the substrate W is taken out by the local transport mechanism 34 and is transported to the temporary substrate rest part. At this time, the substrate W is cooled by a cooling mechanism provided for the local transport mechanism 34. Thereafter, the substrate W transported to the temporary substrate rest part having undergone the thermal process is taken out by the transport robot TR2.

As described, in each of the heating units PHP1 to PHP6, the transport robot TR2 only transfers and receives a substrate W to and from the temporary substrate rest part at room temperature, not to and from the hot plate. This can prevent a rise in temperature of the transport robot TR2. Further, the hot plate is opened only toward the local transport mechanism 34, which can prevent the transport robot TR2 and resist coating processor SC from suffering from the adverse effect which would be caused by hot atmosphere leaked out from the hot plate. The transport robot TR2 transfers and receives a substrate W directly to and from the cooling plates CP4 to CP9.

The transport robot TR2 has exactly the same construction as the transport robot TR1. Accordingly, the transport robot TR2 moves its two holding arms to independently get access to the substrate rest parts PASS3, PASS4, the thermal processing units provided in the thermal processing towers 31, the coating processing units provided in the resist coating processor SC and the substrate rest parts PASS5 and PASS6 which will be described later, so that a substrate W can be transferred and received to and from these units.

Next, the inspection block IB will be described. The inspection block IB is sandwiched between the resist coating block 3 and development processing block 4. Between the resist coating block 3 and inspection block IB, a partition 35 for closing off the communication of atmosphere between the blocks is provided. The two substrate rest parts PASS5 and PASS6 each for placing a substrate W thereon to transfer the substrate W between the resist coating block 3 and inspection block IB are arranged in stacked relation to extend through this partition 35. The substrate rest parts PASS5 and PASS6 have the same construction as the above-described substrate rest parts PASS1 and PASS2.

The upper substrate rest part PASS5 is used to transfer a substrate W from the resist coating block 3 to the inspection block IB. That is, a transport robot TR5 of the inspection block IB receives a substrate W placed on the substrate rest part PASS5 by the transport robot TR2 of the resist coating block 3. The lower substrate rest part PASS6 is used to transport a substrate W from the inspection block IB to the resist coating block 3. That is, the transport robot TR2 of the resist coating block 3 receives a substrate W placed on the substrate rest part PASS6 by the transport robot TR5 of the inspection block IB.

The substrate rest parts PASS5 and PASS6 both partly extend through part of the partition 35, and are each provided with an optical sensor (not shown) for detecting the presence or absence of a substrate W. In response to detection signals from the respective sensors, it is judged whether or not the transport robots TR2 and TR5 are in a state of readiness to transfer and receive a substrate W to and from the substrate rest parts PASS5 and PASS6. Further, two cooling plates WCP for roughly water-cooling a substrate W are provided in stacked relation under the substrate rest parts PASS5 and PASS6 to extend through the partition 35.

The inspection block IB is a processing block for inspecting a substrate W having undergone a series of photolithography processes or on the way of the processes. The inspection block IB comprises a film thickness measurement unit 80, a line width measurement unit 85, a macro defect inspection unit 90, an inspection buffer 95 and the transport robot TR5 for transferring and receiving a substrate W to and from these units. The transport robot TR5 has exactly the same construction as the above-described transport robots TR1 and TR2.

As shown in FIG. 2, the film thickness measurement unit 80 is positioned on the front side of the apparatus at the lower stage. The film thickness measurement unit 80 includes a film thickness measuring device 81 for optically measuring the film thickness of the resist which coats a substrate W. The line width measurement unit 85 is positioned on the front side of the apparatus at the upper stage. The line width measurement unit 85 includes a line width measuring device 86 for optically measuring the line width of the pattern transferred to a substrate W having undergone the development process.

On the other hand, as shown in FIG. 3, the macro defect inspection unit 90 is positioned on the rear side of the apparatus at the lower stage of the inspection block IB. The macro defect inspection unit 90 includes a macro defect inspecting device 91 for optically detecting a relatively large defect appeared on a substrate W, e.g., adhesion of particles or nonuniform coating of the resist. The inspection buffer 95 is provided in two rows above the macro defect inspection unit 90, i.e., on the rear side of the apparatus at the upper stage of the inspection block IB. The inspection buffer 95 includes a cabinet capable of storing a plurality of substrates W in tiers. When a substrate W is subjected to an inspection in any one of the film thickness measurement unit 80, line width measurement unit 85 and macro defect inspection unit 90, the inspection buffer 95 is used to temporarily store substrates W to be subsequently inspected at these units.

The film thickness measurement unit 80, line width measurement unit 85 and macro defect inspection unit 90 are not limited to the above-described positions, but the positions may be interchanged.

The transport robot TR5 has exactly the same construction as the transport robot TR1. Accordingly, the transport robot TR5 moves its two holding arms to independently get access to the substrate rest parts PASS5, PASS6, film thickness measurement unit 80, line width measurement unit 85, macro defect inspection unit 90, inspection buffer 95 and substrate rest parts PASS 7 and PASS 8 which will be described later, so that a substrate W can be transferred and received to and from these units.

With respect to the inspection block IB, the substrate rest part PASS5 serves as an inlet substrate rest part in a feed direction, and the substrate rest part PASS7 serves as an outlet substrate rest part in the feed direction. Also with respect to the inspection block IB, the substrate rest part PASS8 serves as an inlet substrate rest part in a return direction, and the substrate rest part PASS6 serves as an outlet substrate rest part in the return direction. "The feed direction" is a direction in which a substrate W yet to be exposed is transported from the indexer block 1 to the interface block 5, while "the return direction" is a direction in which a substrate W as exposed is transported from the interface block 5 to the indexer block 1. "The inlet substrate rest part" is for placing a substrate W thereon for transporting the substrate W into the inspection block IB, while "the outlet substrate rest part" is for placing a substrate W thereon for transporting the substrate W out of the inspection block IB.

Next, the development processing block 4 will be described. The development processing block 4 is sandwiched between the inspection block IB and interface block 5. Between the inspection block IB and development processing block 4, a partition 45 for closing off the communication of atmosphere between the blocks is provided. The two substrate rest parts PASS7 and PASS8 each for placing a substrate W thereon to transfer the substrate W between the inspection block IB and development processing block 4 are arranged in stacked relation to extend through this partition 45. The substrate rest parts PASS7 and PASS8 have the same construction as the above-described substrate rest parts PASS1 and PASS2.

The upper substrate rest part PASS7 is used to transfer a substrate W from the inspection block IB to the development processing block 4. That is, a transport robot TR3 of the development processing block 4 receives a substrate W placed on the substrate rest part PASS7 by the transport robot TR5 of the inspection block IB. The lower substrate rest part PASS8 is used to transport a substrate W from the development processing block 4 to the inspection block IB. That is, the transport robot TR5 of the inspection block IB receives a substrate W placed on the substrate rest part PASS8 by the transport robot TR3 of the development processing block 4.

The substrate rest parts PASS7 and PASS8 both partly extend through part of the partition 45, and are each provided with an optical sensor (not shown) for detecting the presence or absence of a substrate W. In response to detection signals from the respective sensors, it is judged whether or not the transport robots TR5 and TR3 are in a state of readiness to transfer and receive a substrate W to and from the substrate rest parts PASS7 and PASS8. Further, two cooling plates WCP for roughly water-cooling a substrate W are provided in stacked relation under the substrate rest parts PASS7 and PASS8 to extend through the partition 45.

The development processing block 4 is a processing block for performing a development process on an exposed substrate W. The development processing block 4 comprises a development processor SD for performing a development process by supplying a developing solution onto a substrate W with a pattern transferred thereto by exposure, two thermal processing towers 41, 42 each for performing a thermal process associated with the development process and the transport robot TR3 for transferring and receiving a substrate W to and from the development processor SD and thermal processing towers 41, 42. The transport robot TR3 has exactly the same construction as the above-described transport robot TR1.

As shown in FIG. 2, the development processor SD includes five development processing units SD1 to SD5 all having the same construction, stacked in ascending order. Hereinafter, where there is no need to distinguish these five development processing units SD1 to SD5 from one another, these units will collectively be referred to as the development processor SD. Each of the development processing units SD1 to SD5 is provided with a spin chuck 43 for rotating a substrate W within an almost horizontal plane while holding the substrate W in an almost horizontal position under suction, a discharging nozzle 44 for discharging a developing solution onto the substrate W held on the spin chuck 43, a spin motor (not shown) for rotatably driving the spin chuck 43, a cup (not shown) for surrounding the substrate W held on the spin chuck 43, and the like.

As shown in FIG. 3, the thermal processing tower 41 located close to the indexer block 1 is provided with five hot plates HP7 to HP11 for heating a substrate W to a predetermined temperature and cooling plates CP10 to CP12 for cooling the heated substrate W to a predetermined temperature and maintaining the substrate W at the predetermined temperature. In this thermal processing tower 41, the cooling plates CP10 to CP12 and the hot plates HP7 to HP11 are stacked in ascending order. On the other hand, in the thermal processing tower 42 located away from the indexer block 1, six heating units PHP7 to PHP12 and a cooling plate CP13 are provided in stacked relation. Each of the heating units PHP7 to PHP12 is a thermal processing unit having a temporary substrate rest part and a local transport mechanism, similarly to the heating units PHP1 to PHP6. However, the temporary substrate rest part of each of the heating units PHP7 to PHP12 is opened toward a transport robot TR4 of the interface block 5, but is closed toward the transport robot TR3 of the development processing block 4. In other words, the transport robot TR4 of the interface block 5 is capable of getting access to the heating units PHP7 to PHP12, while the transport robot TR3 of the development processing block 4 is not. To the thermal processing units provided in the thermal processing tower 41, the transport robot TR3 of the development processing block 4 gets access.

In the thermal processing tower 42, the two substrate rest parts PASS9 and PASS10 for transferring a substrate W between the development processing block 4 and interface block 5 adjacent thereto are arranged one above the other in close contact with each other. The upper substrate rest part PASS9 is used to transfer a substrate W from the development processing block 4 to the interface block 5. That is, the transport robot TR4 of the interface block 5 receives a substrate W placed on the substrate rest part PASS9 by the transport robot TR3 of the development processing block 4. The lower substrate rest part PASS10 is used to transport a substrate W from the interface block 5 to the development processing block 4. That is, the transport robot TR3 of the development processing block 4 receives a substrate W placed on the substrate rest part PASS10 by the transport robot TR4 of the interface block 5. The substrate rest parts PASS9 and PASS10 are each opened toward both the transport robot TR3 of the development processing block 4 and the transport robot TR4 of the interface block 5.

Next, the interface block 5 will be described. The interface block 5 is provided adjacently to the development processing block 4, and transfers and receives a substrate W to and from an exposure apparatus which is an external apparatus provided separately from the substrate processing apparatus of the present invention. The interface block 5 according to the present embodiment comprises a transport mechanism 55 for transferring and receiving a substrate W to and from the exposure apparatus as well as two edge exposure units EEW for exposing the periphery of a substrate W with a photoresist film formed thereon and the transport robot TR4 for transferring and receiving a substrate W to and from the heating units PHP7 to PHP12 provided in the development processing block 4 and the edge exposure units EEW.

As shown in FIG. 2, each of the edge exposure units EEW is provided with a spin chuck 56 for rotating a substrate W within an almost horizontal plane while holding the substrate W in an almost horizontal position under suction, a light irradiator 57 for irradiating light to expose the periphery of the substrate W held on the spin chuck 56 to light, and the like. The two edge exposure units EEW are arranged in stacked relation in the center of the interface block 5. The transport robot TR4 provided adjacently to the edge exposure units EEW and the thermal processing tower 42 of the development processing block 4 has the same construction as the above-described transport robot TR1.

Further, as shown in FIG. 2, a return buffer RBF is provided under the two edge exposure units EEW, and thereunder, the two substrate rest parts PASS11 and PASS12 are arranged in stacked relation. The return buffer RBF is for temporarily storing a substrate W therein upon completion of heating at the heating units PHP7 to PHP12 of the development processing block 4 after the exposure process if the development processing block 4 cannot perform the development process on the substrate W for some trouble. The return buffer RBF includes a cabinet capable of storing a plurality of substrates W in tiers. The upper substrate rest part PASS11 is used to transfer a substrate W from the transport robot TR4 to the transport mechanism 55. The lower substrate rest part PASS12 is used to transport a substrate W from the transport mechanism 55 to the transport robot TR4. To the return buffer RBF, the transport robot TR4 gets access.

As shown in FIG. 2, the transport mechanism 55 has a movable table 55a movable horizontally along the Y axis, and a holding arm 55b for holding a substrate W on the movable table 55a. The holding arm 55b is movable up and down, pivotable and movable back and forth in the direction of the pivot radius with respect to the movable table 55a. With such construction, the transport mechanism 55 transfers and receives a substrate W to and from the exposure apparatus, and also transfers and receives a substrate W to and from the substrate rest parts PASS11 and PASS12, and stores and takes out a substrate W in and from a send buffer SBF. The send buffer SBF is for temporarily storing an unexposed substrate W when the exposure apparatus cannot accept the substrate W, and includes a cabinet capable of storing a plurality of substrates W in tiers.

A downflow of clean air is always supplied into the above-described indexer block 1, BARC block 2, resist coating block 3, development processing block 4, interface block 5 and inspection block IB to thereby avoid the adverse effects of raised particles and gas flows upon the processes in the respective blocks. The interior of each of the blocks is held at a slightly positive pressure relative to the external environment to prevent particles and contaminants in the external environment from entering the blocks 1 to 5.

Further, the above-described indexer block 1, BARC block 2, resist coating block 3, development processing block 4, interface block 5 and inspection block IB are parts obtained by mechanically dividing the substrate processing apparatus according to the present embodiment. Each of the blocks is fitted into an individual block-specific frame, and the respective block-specific frames are connected to one another to construct the substrate processing apparatus.

On the other hand, in the present embodiment, the transport of substrates W is effected on the basis of transport control units, different from mechanically divided blocks. In this specification, such transport control units for the substrate transport are referred to as "cells." Each cell comprises a plurality of processing units for performing a predetermined process on a substrate W and a transport robot for transporting the substrate W to the plurality of processing units. Each of the above-described substrate rest parts serves as an inlet substrate rest part for receiving a substrate W into a cell or an outlet substrate rest part for transporting a substrate W from a cell. The transfer of a substrate W between cells is conducted through the substrate rest parts. In the present specification, the substrate rest parts just for placing a substrate W thereon are included in "processing units" in the sense that a substrate W is to be transported thereto, in addition to the thermal processing units, coating/development processing units and edge exposure units. The substrate transport mechanism 12 and transport mechanism 55 are included in transport robots as they transport substrates W.

The substrate processing apparatus according to the present embodiment comprises seven cells: an indexer cell; a BARC cell; a resist coating cell; an inspection cell; a development processing cell; a post-exposure bake cell; and an interface cell. The indexer cell includes the carrier table 11 and substrate transport mechanism 12, and as a result has the same construction as the indexer block 1 which is a mechanically divided part. The BARC cell includes the underlying film coating processor BRC, two thermal processing towers 21, 21 and transport robot TR1. This BARC cell also as a result has the same construction as the BARC block 2 which is a mechanically divided part. The resist coating cell includes the resist coating processor SC, two thermal processing towers 31, 31 and transport robot TR2. This resist coating cell also as a result has the same construction as the resist coating block 3 which is a mechanically divided part. The inspection cell includes the film thickness measurement unit 80, line width measurement unit 85, macro defect inspection unit 90, inspection buffer 95 and transport robot TR5. This inspection cell also as a result has the same construction as the inspection block IB which is a mechanically divided part.

The development processing cell includes the development processor SD, thermal processing tower 41 and transport robot TR3. As described, the transport robot TR3 is incapable of getting access to the heating units PHP7 to PHP12 of the thermal processing tower 42, and therefore the thermal processing tower 42 is not included in the development processing cell. In this respect, the development processing cell differs from the development processing block 4 which is a mechanically divided part.

The post-exposure bake cell includes the thermal processing tower 42 located in the development processing block 4, edge exposure units EEW located in the interface block 5 and transport robot TR4. In other words, the post-exposure bake cell extends from the development processing block 4 to the interface block 5 which are mechanically divided parts. As described, the heating units PHP7 to PHP12 for performing a post-exposure heating process and the transport robot TR4 are included in one cell, which allows an exposed substrate W to be readily transported into the heating units PHP7 to PHP12 for performing a heating process thereon. Such construction is desirable in the case of using a chemically amplified resist that requires a heating process to be performed as soon as possible after transferring a pattern to a substrate W by exposure.

The substrate rest parts PASS9 and PASS10 included in the thermal processing tower 42 are provided for transferring a substrate W between the transport robot TR3 of the development processing cell and the transport robot TR4 of the post-exposure bake cell.

The interface cell includes the transport mechanism 55 for transferring and receiving a substrate W to and from the exposure apparatus which is an external apparatus. This interface cell does not include the transport robot TR4 or edge exposure units EEW, and, in this sense, has a different construction from the interface block 5 which is a mechanically divided part. The substrate rest parts PASS11 and PASS12 provided under the edge exposure units EEW are provided for transferring a substrate W between the transport robot TR4 of the post-exposure bake cell and the transport mechanism 55 of the interface cell.

Figure 6:
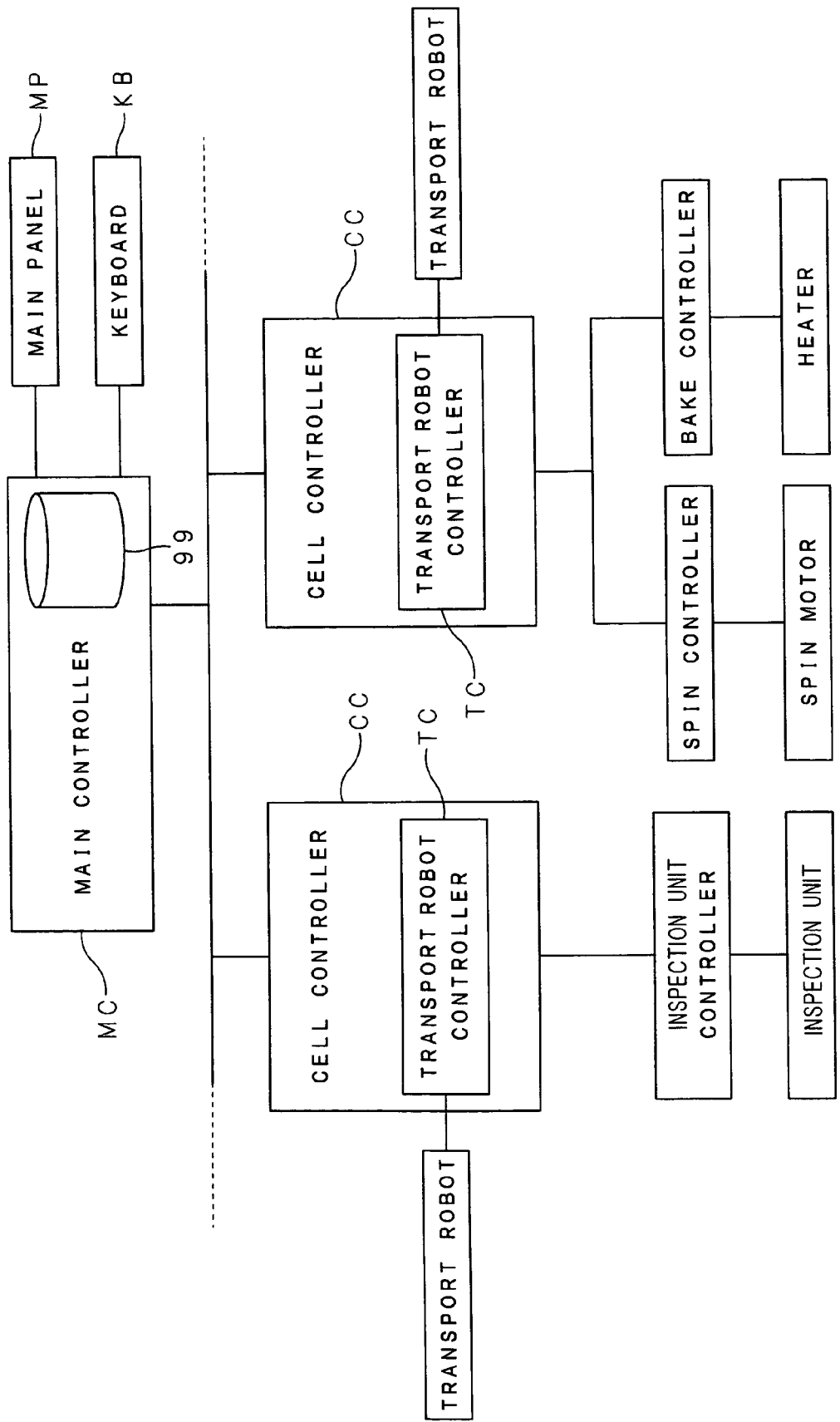
FIG. 6 is a block diagram schematically showing a control mechanism of the substrate processing apparatus shown in FIG. 1.

Next, a control mechanism of the substrate processing apparatus according to the present embodiment will be described. FIG. 6 is a block diagram schematically showing the control mechanism. As shown in the drawing, the substrate processing apparatus of the present embodiment has a three-level control hierarchy including a main controller MC, cell controllers CC and unit controllers. The hardware construction of each of the main controller MC, cell controllers CC and unit controllers is similar to that of a general computer. That is, each of the controllers includes a CPU for performing various operations, a ROM which is a read-only memory for storing a fundamental program, a RAM which is a readable and writable memory for storing various types of information, a magnetic disk for storing a control-dedicated application and data, and the like.

At the first level, one main controller MC is provided in the whole substrate processing apparatus, and is mainly responsible for controlling the whole apparatus, a main panel MP and cell controllers CC. The main panel MP serves as a display of the main controller MC. Various commands can be input to the main controller MC using a keyboard KB. The main panel MP may be a touch panel, so that an input operation to the main controller MC may be carried out through the main panel MP. The main controller MC has a magnetic disk 99, in which a control-dedicated application for controlling the whole apparatus and the like are stored.

The cell controllers CC at the second level are provided in one-to-one correspondence to the seven cells (indexer cell, BARC cell, resist coating cell, inspection cell, development processing cell, post-exposure bake cell and interface cell). Each of the cell controllers CC is mainly responsible for controlling substrate transport within a corresponding one of the cells and controlling the units. Specifically, transmission of information is performed in such a manner that a cell controller CC corresponding to a cell sends information that a substrate W has been placed on a predetermined substrate rest part to a cell controller CC corresponding to an adjacent cell, and the cell controller CC corresponding to the adjacent cell having received the substrate W sends back information that it has received the substrate W from the predetermined substrate rest part to the cell controller CC corresponding to the original cell. Such transmission of information is conducted through the main controller MC. Each of the cell controllers CC sends information that a substrate W has been transported into a corresponding cell to a corresponding transport robot controller TC. The corresponding transport robot controller TC controls a corresponding transport robot to circularly transport a substrate W within a corresponding cell in accordance with a predetermined procedure (flow recipe). As an example, the information indicating that a substrate W has been placed on the substrate rest part PASS8 is received by the cell controller CC for the inspection cell CC. This information is then given to the transport robot controller TC for the inspection cell. On receipt of this information, the transport robot controller TC controls the transport robot TR5 to transport the substrate W in accordance with a predetermined procedure within the inspection cell. Each of the transport robot controllers TC is a control part achieved by a predetermined application operated on a corresponding cell controller CC.

As the unit controllers at the third level, a spin controller and a bake controller are provided, for example. The spin controller directly controls spin units (coating processing units and development processing units) provided in a corresponding cell, in accordance with an instruction from a corresponding cell controller CC. Specifically, the spin controller controls spin motors for the spin units to adjust the revolution per minute of a substrate W. The bake controller directly controls the thermal processing units (hot plates, cooling plates, heating units, etc.) provided in a corresponding cell, in accordance with an instruction from a corresponding cell controller CC. Specifically, the bake controller controls heaters internally provided for the hot plates, for example, to adjust the plate temperature and the like. An inspection unit controller provided as a unit controller particularly in correspondence to the inspection cell directly controls the inspection units (film thickness measurement unit 80, line width measurement unit 85 and macro defect inspection unit 90).

As described above, the present embodiment reduces a controlling burden placed on each of the controllers with the three-level control hierarchy. Further, each of the cell controllers CC only controls a substrate transport schedule within a corresponding cell, without considering a substrate transport schedule within an adjacent cell. This lightens a transport-controlling burden placed on each of the cell controllers CC. As a result, the throughput of the substrate processing apparatus can be increased.

Next, the operation of the substrate processing apparatus according to the present embodiment will be described. First, the substrate transport mechanism 12 of the indexer cell (indexer block 1) takes out an unprocessed substrate W from a predetermined carrier C, and places the substrate W on the upper substrate rest part PASS1. The transport robot TR1 of the BARC cell receives the unprocessed substrate W placed on the substrate rest part PASS1 using one of the holding arms 6a and 6b. Then, the transport robot TR1 transports the received unprocessed substrate W to any one of the coating processing units BRC1 to BRC3, which applies a coating solution for the antireflective film onto the substrate W while rotating the substrate W.

Upon completion of the coating process, the substrate W is transported by the transport robot TR1 to any one of the hot plates HP1 to HP6, where the substrate W is heated, so that the coating solution is dried and an underlying antireflective film is formed on the substrate W. Thereafter, the substrate W taken out from the one of the hot plates HP1 to HP6 by the transport robot TR1 is transported to any one of the cooling plates CP1 to CP3 to be cooled. At this time, the substrate W may be cooled by any one of the cooling plates WCP. The cooled substrate W is placed on the substrate rest part PASS3 by the transport robot TR1.

Alternatively, the unprocessed substrate W placed on the substrate rest part PASS1 may be transported to any one of the adhesion promotion processing units AHL1 to AHL3 by the transport robot TR1. The adhesion promotion processing units AHL1 to AHL3 perform a thermal process on the substrate W in an atmosphere of HMDS vapor to promote the adhesion of the resist film to the substrate W. The substrate W having undergone the adhesion promoting process is taken out by the transport robot TR1, and is transported to any one of the cooling plates CP1 to CP3 to be cooled. Since the antireflective film is not formed on the substrate W having undergone the adhesion promoting process, the cooled substrate W is directly placed on the substrate rest part PASS3 by the transport robot TR1.

Still alternatively, a dehydration process may be performed before applying the coating solution for the antireflective film. In that case, the unprocessed substrate W placed on the substrate rest part PASS1 is first transported to any one of the adhesion promotion processing units AHL1 to AHL3 by the transport robot TR1. The adhesion promotion processing units AHL1 to AHL3 perform a heating process (dehydration bake) on the substrate W just for dehydration without supplying an HMDS vapor. Upon completion of the heating process for dehydration, the substrate W is taken out by the transport robot TR1, and is transported to any one of the cooling plates CP1 to CP3 to be cooled. The cooled substrate W is transported by the transport robot TR1 to any one of the coating processing units BRC1 to BRC3, which applies the coating solution for the antireflective film onto the substrate W while rotating the substrate W. Then, the substrate W is transported by the transport robot TR1 to any one of the hot plates HP1 to HP6, where the antireflective film as an underlying film is formed on the substrate W by the heating process. Thereafter, the substrate W taken out from the one of the hot plates HP1 to HP6 by the transport robot TR1 is transported to any one of the cooling plates CP1 to CP3 to be cooled, and is then placed on the substrate rest part PASS3.

The transport robot TR2 of the resist coating cell receives the substrate W placed on the substrate rest part PASS3, and transports the substrate W to any one of the coating processing units SC1 to SC3. The coating processing units SC1 to SC3 apply the photoresist to the substrate W while rotating the substrate W. Since the resist coating process requires the substrate temperature to be precisely controlled, the substrate W may be transported to any one of the cooling plates CP4 to CP9 just before being transported to any one of the coating processing units SC1 to SC3.

Upon completion of the resist coating process, the substrate W is transported to any one of the heating units PHP1 to PHP6 by the transport robot TR2. The substrate W is heated in the one of the heating units PHP1 to PHP6, so that a solvent component in the photoresist is removed, whereby the resist film is formed on the substrate W. Thereafter, the substrate W taken out from the one of the heating units PHP1 to PHP6 by the transport robot TR2 is transported to any one of the cooling plates CP4 to CP9 to be cooled. The cooled substrate W is placed on the substrate rest part PASS5 by the transport robot TR2.

The transport robot TR5 of the inspection cell receives the substrate W with the resist film formed thereon placed on the substrate rest part PASS5, and transports the substrate W to the film thickness measurement unit 80. The film thickness measurement unit 80 measures the film thickness of the resist formed on the substrate W, thereby inspecting whether or not the resist film has a film thickness falling within a predetermined range. The substrate W having undergone the film thickness inspection is taken out from the film thickness measurement unit 80 by the transport robot TR5, and is placed on the substrate rest part PASS7. The film thickness inspection may not be necessarily performed on all substrates W but may be performed only on some predetermined substrates W.

The transport robot TR3 of the development processing cell receives the substrate W placed on the substrate rest part PASS7, and directly places the substrate W on the substrate rest part PASS9. Then, the substrate W placed on the substrate rest part PASS9 is received by the transport robot TR4 of the post-exposure bake cell, and is transported into the edge exposure units EEW. In the edge exposure units EEW, an exposure process is performed on the periphery of the substrate W. Upon completion of the edge exposure process, the substrate W is placed on the substrate rest part PASS11 by the transport robot TR4. Then, the substrate W placed on the substrate rest part PASS11 is received by the transport mechanism 55 of the interface cell, and is transported into the exposure apparatus outside the substrate processing apparatus to be subjected to an exposure process for transferring a pattern thereto.

Upon completion of the exposure process for pattern transfer, the substrate W is again returned to the interface cell, and is placed on the substrate rest part PASS12 by the transport mechanism 55. The transport robot TR4 of the post-exposure bake cell receives the exposed substrate W placed on the substrate rest part PASS12, and transports the substrate W to any one of the heating units PHP7 to PHP12. The heating units PHP7 to PHP12 perform a heating process (post-exposure bake) for causing products generated by a photochemical reaction during the exposure to be uniformly diffused within the resist film. Upon completion of the post-exposure heating process, the substrate W is taken out by the transport robot TR4, and is transported to the cooling plate CP13 to be cooled. The cooled substrate W is placed on the substrate rest part PASS10 by the transport robot TR4.

The transport robot TR3 of the development processing cell receives the substrate W placed on the substrate rest part PASS10, and transports the substrate W to any one of the development processing units SD1 to SD5. The development processing units SD1 to SD5 supply the developing solution onto the substrate W to promote the development process. After a while upon completion of the development process, the substrate W is transported to any one of the hot plates HP7 to HP11 by the transport robot TR3 to be heated, and then transported to any one of the cooling plates CP10 to CP12 to be cooled. The cooled substrate W is placed on the substrate rest part PASS8 by the transport robot TR3.

In the above-described steps, substrates W are successively transported to the substrate rest part PASS8 in the order transferred out of the indexer block 1. That is, substrates W transferred out of the indexer block 1 in a predetermined order are transported without change in that order in the feed direction in which the resist coating process is performed, and are once transported from the interface block 5 to the outside of the apparatus to be subjected to the exposure process for transferring a pattern. Then, exposed substrates W are returned to the interface block 5 in the predetermined order, and are transported without change in that order in the return direction in which the development process is performed, and are then placed on the substrate rest part PASS8. Some of the substrates W placed on the substrate rest part PASS8 are subjected to the line width inspection and/or the macro defect inspection, and the rest of the substrates W are non-inspected substrates which are not to be subjected to either of the inspections. Which inspection is to be made on a substrate W is previously described in a flow recipe defining the transport procedure for the substrate W. The flow recipe is stored in the magnetic disk 99 of the main controller MC, and upon start of processing on the substrate W, the flow recipe is divided into pieces to be given to respective cell controllers CC from the main controller MC.

Figure 7:
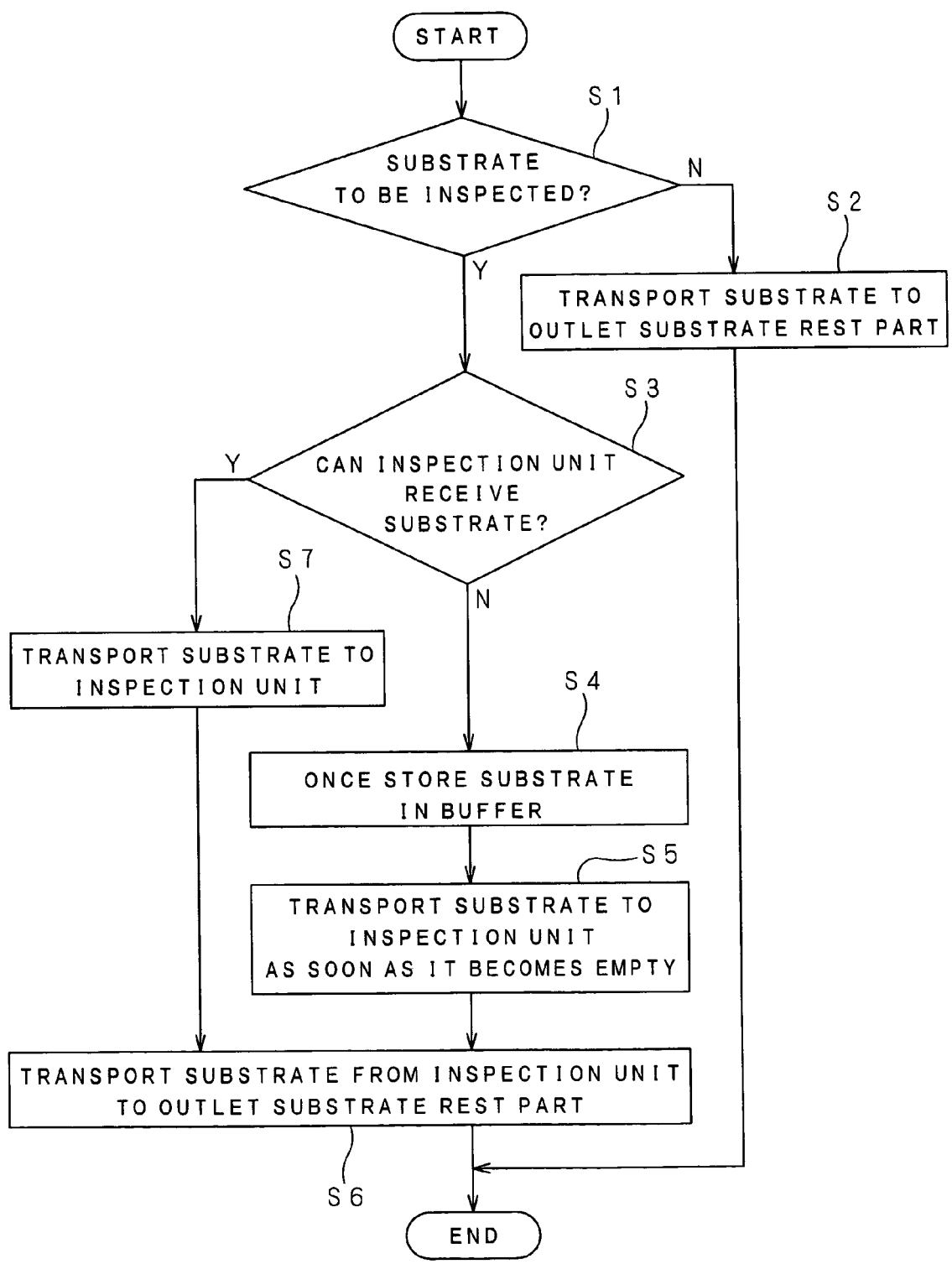
FIG. 7 is a flow chart of procedural steps taken at an inspection block.

FIG. 7 is a flow chart of procedural steps taken at the inspection block IB when a substrate W is placed on the substrate rest part PASS8. First, a cell controller CC for the inspection cell judges whether or not the substrate placed on the substrate rest part PASS8 (inlet substrate rest part) is to be subjected to the line width inspection and/or the macro defect inspection (step S1). This judgment is made on the basis of the flow recipe describing the substrate W placed on the substrate rest part PASS8.

In the case where the substrate W placed on the substrate rest part PASS8 is to be subjected to an inspection, a cell controller CC judges whether or not the substrate W can be transported to an inspection unit performing the inspection (step S3). For instance, in the case where the substrate W placed on the substrate rest part PASS8 is to be subjected to the line width inspection, the cell controller CC judges whether or not the line width measurement unit 85 can receive the substrate W. If yes, that is, when a corresponding inspection unit is empty, the process progresses into step S7, in which the transport robot TR5 receives the substrate W from the substrate rest part PASS8 and transports the substrate W to the inspection unit. The substrate W transported into the inspection unit is subjected to a predetermined inspection. Specifically, the line width measurement unit 85 measures the line width of the pattern formed on the substrate W having undergone the development process for inspecting whether or not the pattern has a line width falling within a predetermined range. The macro defect inspection unit 90 inspects the substrate W having undergone the development process for the presence or absence of a relatively large defect (macro defect) appearing thereon. Upon completion of the inspection, the process progresses into step S6, in which the transport robot TR5 takes out the substrate W from the inspection unit, and transports the substrate W to the substrate rest part PASS6 (outlet substrate rest part) for placing the substrate W thereon. Some substrates W are subjected to both of the line width inspection and the macro defect inspection. In such a case, the process returns to the judgment at the step S3 after one of the inspections is finished.

When it is judged in step S3 that an inspection unit cannot receive the substrate W, that is, in the case where the inspection unit is making an inspection on a preceding substrate to be inspected, the process progresses into step S4, in which the transport robot TR5 receives the substrate W from the substrate rest part PASS8 and transports the substrate W into the inspection buffer 95 for storing the substrate W therein. Even if a substrate W to be inspected is placed on the substrate rest part PASS8 when the inspection unit is not empty, once storing the substrate W in the inspection buffer 95 can prevent the substrate rest part PASS8 from being occupied by substrates W yet to be inspected. As a result, interruption of processing on subsequent substrates W can be prevented.

Then, as soon as the inspection unit becomes empty after the inspection on a preceding substrate to be inspected is finished, the transport robot TR5 takes out the substrate W once stored in the inspection buffer 95 and transports the substrate W into the inspection unit (step S5). Upon completion of an inspection at the inspection unit, the processing progresses into step S6 as described above, in which the transport robot TR5 takes out the substrate W from the inspection unit and transports the substrate W to the substrate rest part PASS6 for placing the substrate W thereon.

On the other hand, in step S1, when the substrate W placed on the substrate rest part PASS8 is judged as a non-inspected substrate which is not to be inspected, the processing progresses into step S2, in which the transport robot TR5 takes out the non-inspected substrate W from the substrate rest part PASS8 and transports the substrate W directly to the substrate rest part PASS6 for placing the substrate W thereon. At this time, while the inspection unit is making an inspection on a preceding substrate to be inspected transferred out of the indexer block 1 earlier, a subsequent non-inspected substrate placed on the substrate rest part PASS8 may be transported to the substrate rest part PASS6. That is, the cell controller CC for the inspection cell allows a subsequent substrate W not to be inspected among substrates having undergone the development process to pass a preceding substrate W to be inspected, at the inspection block IB.

The substrate W placed on the substrate rest part PASS6 is directly placed on the substrate rest part PASS4 by the transport robot TR2 of the resist coating cell. Further, the substrate W placed on the substrate rest part PASS4 is directly placed on the substrate rest part PASS2 by the transport robot TR1 of the BARC cell. The processed substrate W placed on the substrate rest part PASS2 is stored in a predetermined carrier C by the substrate transport mechanism 12 of the indexer cell. A series of photolithography processes is thereby completed.

In the steps subsequent to the substrate rest part PASS6, substrates W are transported along the return direction in a different order from the order transferred out of the indexer block 1, and are returned to the indexer block 1. That is, non-inspected substrates W having passed substrates W to be inspected, at the inspection block IB, are returned to the indexer block 1 in the order after the passing.

As described, the present embodiment allows non-inspected substrates transferred out of the indexer block 1 later to pass preceding substrates to be inspected, at the inspection block IB. This eliminates the need to transport non-inspected substrates to and from inspection units without any processing as in conventional cases, which can improve the transport efficiency, to thereby achieve a higher throughput. Further, it is possible to avoid unnecessary operations of the inspection units and transport robot TR5 of the inspection block IB, which leads to energy savings.

Furthermore, in the present embodiment, subsequent non-inspected substrates W having passed preceding substrates W to be inspected at the inspection block IB are returned to the indexer block 1 in the order after the passing, which can achieve higher transport efficiency. That the non-inspected substrates W can be returned to the indexer block 1 in the order after the non-inspected substrates W pass preceding substrates W to be inspected is because the BARC block 2 and resist coating block 3 in the return direction merely serve to pass substrates W having undergone the development process. If substrates W are transported into a processing unit performing a certain kind of substrate processing in a different order from the order transferred out of the indexer block 1, a control program for each processing unit becomes extremely complicated. Therefore, non-inspected substrates W are not allowed to pass, at the inspection block IB, preceding substrates W to be subjected to the film thickness measurement in the feed direction because control programs for the exposure apparatus and the like would be extremely complicated.

The present invention is not limited to the above example described in this preferred embodiment. For instance, inspections performed on substrates W having undergone the development process are described as the line width inspection at the line width measurement unit 85 and the macro defect inspection at the macro defect inspection unit 90, however, the inspections are not limited as such. Overlay measurement for measuring a misalignment between patterns formed on a substrate W having undergone the development process may be performed. In that case, an overlay measurement unit for measuring a misalignment between patterns may be provided for the inspection block IB instead of, for example, the film thickness measurement unit 80.

Further, in the above preferred embodiment, the inspection unit controller directly controls the inspection units, however, the inspection unit controller may not directly control the inspection units, but may solely serve as an interface between the cell controller CC and inspection units (serving to be an interlock when a substrate W is transferred to an inspection unit, to instruct an inspection recipe for use in the inspection unit, to receive inspection data from the inspection unit, and the like). In that case, an individual controller is provided for each of the inspection units, and the inspection unit controller is arranged between each of the controllers and the cell controller CC. In this case, the inspection unit controller may be achieved by a predetermined application operating on the cell controller CC.

The construction of the substrate processing apparatus according to the present invention is not limited to that shown in FIGS. 1 to 4, but various modifications are available in any configuration for performing the resist coating process on substrates W transferred out of the indexer in a predetermined order, as well as performing the development process on substrates W once transported to the outside of the apparatus to undergo the exposure process and then transported back into the apparatus, making an inspection on some of the substrates W, and returning the substrates W to the indexer.

While the invention has been shown and described in detail, the foregoing description is in all aspects illustrative and not restrictive. It is therefore understood that numerous modifications and variations can be devised without departing from the scope of the invention.

What is claimed is:

1. A substrate processing apparatus for performing a resist coating process on substrates transferred out of an indexer in a predetermined order as well as performing a development process on the substrates once transported out of said substrate processing apparatus to undergo an exposure process and then transported back into said substrate processing apparatus, and then returning the substrates to said indexer, said substrate processing apparatus comprising:

an inspection block including an inspection unit for making a predetermined inspection on substrates having undergone said development process and a transport mechanism for transferring substrates to and from said inspection unit; and a transport control unit configured to control said transport mechanism to allow first substrates not to be inspected among substrates having undergone said development process to bypass the inspection unit and to precede second substrates to be inspected, at said inspection block, in the predetermined order.

2. The substrate processing apparatus according to claim 1, wherein said transport control unit is configured to control said transport mechanism to return said first substrates, having preceded said second substrates at said inspection block, to said indexer in an altered predetermined order with the first substrates preceding the second substrates.

3. The substrate processing apparatus according to claim 1, wherein said inspection block further includes:

an inlet substrate rest part configured for placing a substrate thereon to transfer the substrate into said inspection block; and an outlet substrate rest part configured for placing a substrate thereon to transfer the substrate out of said inspection block, wherein said transport control unit is configured to control said transport mechanism to cause a substrate not to be inspected, placed on said inlet substrate rest part, to be transported to said outlet substrate rest part, while said inspection unit is making an inspection on a substrate to be inspected.

4. The substrate processing apparatus according to claim 3, wherein said inspection block further includes a buffer configured to store substrates therein, said transport control unit being configured to control said transport mechanism to cause a subsequent substrate yet to be inspected, placed on said inlet substrate rest part, to be stored in said buffer, while said inspection unit is making an inspection on a preceding substrate to be inspected.

5. The substrate processing apparatus according to claim 3, wherein the apparatus is configured to return substrates which preceded substrates to be inspected, at said inspection unit, to said indexer in an altered order of the preceding substrates being prior to the substrates to be inspected.

6. The substrate processing apparatus according to claim 5, wherein said inspection unit is configured to measure the line width of a pattern formed on a substrate having undergone said development process.

7. The substrate processing apparatus according to claim 5, wherein said inspection unit is configured to inspect whether or not a macro defect appears on a substrate having undergone said development process.

8. A substrate processing apparatus for substrates transferred out of an indexer in a predetermined order for processing and being returned to the indexer in the predetermined order, said substrate processing apparatus comprising:

an inspection block including an inspection unit for making a predetermined inspection on selected substrates having undergone processing and a transport mechanism for transferring substrates to and from said inspection unit; and a transport control unit configured to control said transport mechanism to allow first substrates, not selected to be inspected, to bypass the inspection unit and to precede second substrates selected to be inspected, at said inspection block, in the predetermined order.

* * * * *